(12) United States Patent
Hada et al.

(10) Patent No.: US 10,595,399 B2
(45) Date of Patent: Mar. 17, 2020

(54) METHOD OF REDUCING WARPAGE OF AN ORGANIC SUBSTRATE

(71) Applicant: International Business Machines Corporation, Armonk, NY (US)

(72) Inventors: Sayuri Hada, Tokyo (JP); Hiroyuki Mori, Shiga-ken (JP); Keishi Okamoto, Kawasaki (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/872,009

(22) Filed: Jan. 16, 2018

(65) Prior Publication Data

US 2019/0053370 A1    Feb. 14, 2019

Related U.S. Application Data

(62) Division of application No. 14/938,917, filed on Nov. 12, 2015, now Pat. No. 9,967,971.

(51) Int. Cl.
*B32B 3/00* (2006.01)
*H05K 1/02* (2006.01)
(Continued)

(52) U.S. Cl.
CPC ........... *H05K 1/0271* (2013.01); *G01B 21/08* (2013.01); *G01B 21/20* (2013.01); *H05K 1/0298* (2013.01);
(Continued)

(58) Field of Classification Search
CPC .. H05K 1/0271; H05K 1/0298; H05K 1/0313; H05K 3/0011; H05K 3/225; G01B 21/08; G01B 21/20
See application file for complete search history.

(56) References Cited

U.S. PATENT DOCUMENTS 8,421,242 B2    4/2013    Chang et al.
9,087,832 B2    7/2015    Huang et al.
(Continued)

FOREIGN PATENT DOCUMENTS

JP    5696302 B2    4/2015

OTHER PUBLICATIONS

Matthew Angyal, An Enhanced Thermo-compression Bonding Process to Address Warpage in 3D Integration of Large Die on Organic Substrates, Electronic Components and Technology Conference (ECTC), 2015 IEEE 65th, May 26-29, 2015, 318-324, IEEE, San Diego, CA, US. http://ieeexplore.ieee.org/xpl/login.jsp?tp=&arnumber=7159611&url=http%3A%2F%2Fieeexplore.ieee.org%2Fxpls%2Fabs_all.jsp%3Farnumber%3D7159611.

(Continued)

*Primary Examiner* — Elizabeth E Mulvaney
(74) *Attorney, Agent, or Firm* — Amin, Turocy & Watson, LLP

(57) ABSTRACT

An organic substrate includes a core layer including organic materials; a first buildup layer on a top surface of the core layer; a second buildup layer on a bottom surface of the core layer; and at least one correction layer formed on at least one part of surfaces of the first buildup layer and the second buildup layer, wherein the correction layer has a thickness which has been calculated using properties of constituent materials including the coefficient of thermal expansion (CTE) and the Young's modulus of the core layer, and CTEs and the Young's modulus of the first and the second buildup layers for reducing warpage of the organic substrate.

8 Claims, 5 Drawing Sheets

(51) Int. Cl.
    *G01B 21/08*     (2006.01)
    *G01B 21/20*     (2006.01)
    *H05K 3/00*     (2006.01)
    *H05K 3/22*     (2006.01)
    *H05K 1/03*     (2006.01)
    *H05K 3/46*     (2006.01)

(52) U.S. Cl.
    CPC ......... *H05K 1/0313* (2013.01); *H05K 3/0011* (2013.01); *H05K 3/225* (2013.01); *H05K 3/4644* (2013.01); *H05K 2201/09136* (2013.01); *H05K 2201/09909* (2013.01); *H05K 2203/013* (2013.01); *H05K 2203/163* (2013.01)

(56) References Cited

U.S. PATENT DOCUMENTS

| | | |
|---|---|---|
| 2009/0310848 A1 | 12/2009 | Dang et al. |
| 2009/0312960 A1* | 12/2009 | Dang ............... G06F 17/5018     702/42 |
| 2010/0247879 A1* | 9/2010 | Lin ............... C04B 35/62218     428/209 |
| 2011/0189440 A1 | 8/2011 | Appleby et al. |
| 2012/0090883 A1 | 4/2012 | Bchir et al. |
| 2012/0292375 A1 | 11/2012 | Blais et al. |
| 2015/0035141 A1 | 2/2015 | Kim et al. |
| 2015/0171024 A1 | 6/2015 | Choi et al. |
| 2015/0318258 A1 | 11/2015 | Sane et al. |
| 2016/0219693 A1 | 7/2016 | Nishimoto et al. |

OTHER PUBLICATIONS

Vincent Fiori, Chip Package Interactions: Package Effects on Copper Pillar Bump Induced BEoL Delaminations & Associated Numerical Developments, Electronic Components and Technology Conference (ECTC), 2015 IEEE 65th, May 26-29, 2015, 1063-1070, IEEE, San Diego, CA, US. http://ieeexplore.ieee.org/xpl/login.jsp?tp=&arnumber=7159726&url=http%3A%2F%2Fieeexplore.ieee.org%2Fxpls%2Fabs_all.jsp%3Farnumber%3D7159726.

Kenji Fukuzono, Low Warpage Coreless Substrate for IC Packages, Transactions of The Japan Institute of Electronics Packaging, Oct. 15, 2012, 55-62, 5(1). https://www.jstage.jst.go.jp/article/jiepeng/5/1/5_55/_article.

* cited by examiner

METHOD OF REDUCING WARPAGE OF AN ORGANIC SUBSTRATE

CROSS-REFERENCE TO RELATED APPLICATION

This application is a Divisional of and claims the benefit under 35 U.S.C. § 120 from U.S. patent application Ser. No. 14/938,917, filed on Nov. 12, 2015, incorporated by reference hereby in its entirety.

FIELD OF THE INVENTION

The present invention relates to an organic substrate, and more specifically, to a method of reducing warpage of an organic substrate used in electronic packaging.

BACKGROUND

Warpage of organic substrates is an important challenge in electronic packaging area because it affects device assembling process and device reliability. The causes for the initial warpage include asymmetric mechanical properties such as coefficients of thermal expansion and modulus of constituent materials. The asymmetry in chemical expansion property also causes substrate warpage.

If the substrate's warpage value does not meet the standards, the substrate is rejected lowering the yield. That is, the organic substrate with big warpage is thrown away without being used.

Therefore it is necessary to correct the substrate's warpage automatically after the production so that its value becomes within the standards and improve the yields.

SUMMARY OF THE INVENTION

The present invention provides a method of reducing warpage of an organic substrate. The method includes the steps of (a) preparing an organic substrate, the organic substrate including a core layer including organic materials, a first buildup layer on a front surface of the core layer, and a second buildup layer on a back surface of the core layer, (b) measuring warpage of the organic substrate, (c) calculating a thickness of a correction layer for reducing the warpage of the organic substrate using properties of constituent materials including the coefficient of thermal expansion (CTE) and the Young's modulus of the core layer, and CTEs and the Young's modulus of the first and the second buildup layers, and (d) forming at least one correction layer having the thickness on at least one part of surfaces of the first buildup layer and the second buildup layer.

The present invention further provides an organic substrate including (a) a core layer including organic materials, (b) a first buildup layer on a top surface of the core layer, (c) a second buildup layer on a bottom surface of the core layer, and (d) at least one correction layer formed on at least one part of surfaces of the first buildup layer and the second buildup layer. In the organic substrate, the correction layer has a thickness which has been calculated using properties of constituent materials including the coefficient of thermal expansion (CTE) and the Young's modulus of the core layer, and CTEs and the Young's modulus of the first and the second buildup layers for reducing warpage of the organic substrate.

The present invention further provides a system for correcting warpage of an organic substrate which includes a core layer, a first buildup layer on a front surface of the core layer, and a second buildup layer on a back surface of the core layer. The system includes (a) a warpage measurement device for measuring warpage of the organic substrate, (b) a controller for calculating a thickness of a correction layer for reducing the warpage of the organic substrate using properties of constituent materials including the coefficient of thermal expansion (CTE) and the Young's modulus of the core layer, and CTEs and the Young's modulus of the first and the second buildup layers, and (c) a correction layer formation device for forming at least one correction layer having the thickness on at least one part of surfaces of the first buildup layer and the second buildup layer.

DETAILED DESCRIPTION OF THE PREFERRED EMBODIMENTS

Figure 1:
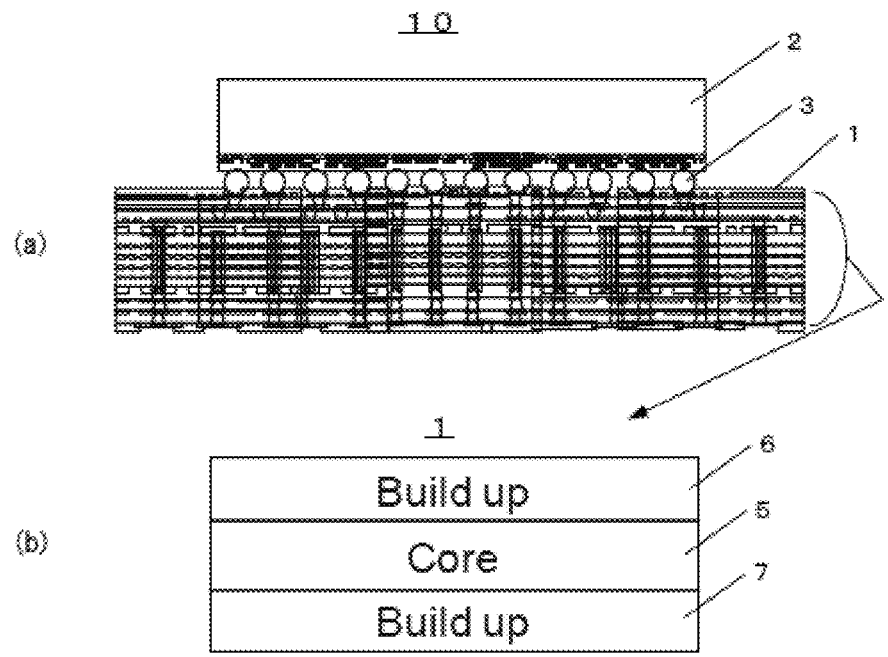
FIG. 1 is a cross-sectional diagram of an electrical package using the organic substrate of one embodiment of the present invention. It includes FIG. 1(a), which is the electrical package including an organic substrate, an IC chip which is electrically connected to the organic substrate via ball grid arrays (BGA) or solder bump arrays and FIG. 1(b), which shows a cross section of the organic substrate.

The following is an explanation of an embodiment of the present invention with reference to the drawings. FIG. 1 is a cross-sectional diagram of an electrical package using the organic substrate of one embodiment of the present invention. In FIG. 1(a), the electrical package 10 includes an organic substrate 1, an IC chip 2 which is electrically connected to the organic substrate via ball grid arrays (BGA) or solder bump arrays 3. The IC chip 2 can include a semiconductor chip (die) such as a silicon chip or other semiconductor chip. The material of the semiconductor chip is not limited to specific types. The BGA 3 can include a plurality of solder balls to connect between electrical pads on the surface of the organic substrate 1 and electrical pads on the surface of the IC chip 2. The solder bump array 3 can include a plurality of flip chip solder bumps to connect between electrical pads on the surface of the organic substrate 1 and electrical pads on the surface of the IC chip 2.

FIG. 1(b) shows a cross section of the organic substrate 1. The organic substrate 1 includes a core layer 5 which is sandwiched by two buildup layers 6, 7. The buildup layer 6 is formed on a top surface of the core layer 5, and the buildup layer 7 is formed on a bottom surface of the core layer 5. The core layer 5 includes organic materials and a plurality of conductive vias to electrically connect between the two buildup layers 6, 7. The core layer 5 further includes metal layers and composite layers with dielectric materials enclosing glass fiber cloth. The composite layers are sandwiched between the metal layers. The buildup layers 6, 7 include a plurality of wiring layers and dielectric layers. The wiring layers include patterned metal layer in a dielectric material. The dielectric layers are in between the wiring layers.

Figure 2:
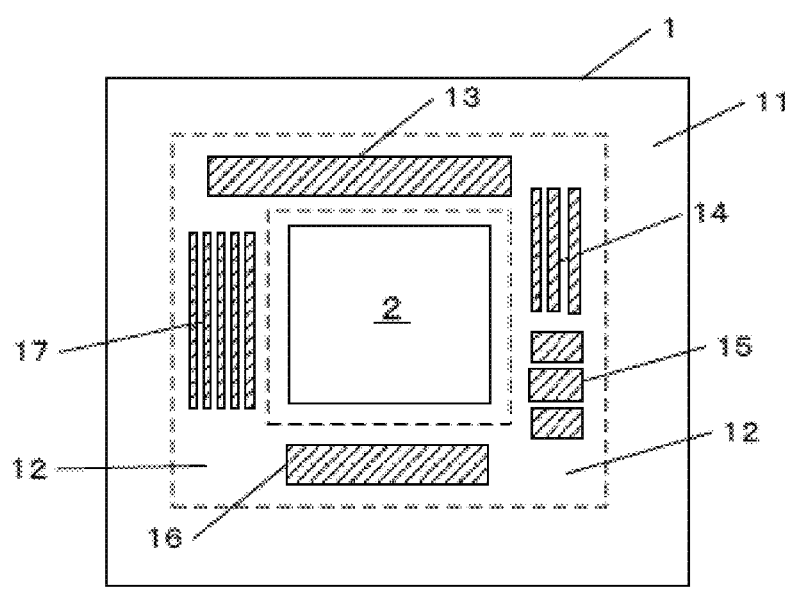
FIG. 2 is a plain diagram showing a surface of the organic substrate of one embodiment of the present invention.

FIG. 2 is a plain diagram showing a surface of the organic substrate 1, more particularly, a surface of the buildup layer 6 of FIG. 1. The area 2 shows the IC chip area on which the IC chip 2 of FIG. 1 is mounted. The area 12 between two dashed lines shows the correction layers area on which the correction layers for reducing warpage of the organic substrate 1 are formed. The area 12 is selected as areas that a chip area, a under fill area and a lid area in the surface of the buildup layer are not included, for example. If the correction layers are formed on a bottom surface of the organic substrate 1, more particularly, on a surface the buildup layer 7 of FIG. 1, the area 12 is selected as areas that a BGA pads area is not included, for example.

As an example, five layers 13-17 are formed in the area 12 in FIG. 2. The number of the correction layers is not limited to five but can form arbitrary numbers of the correction layers. The arrangement, size, thickness and number of the correction layers are decided to become effective in reduction of warpage of the organic substrate. In FIG. 2, the correction layers 14, 15, and 17 are formed as patterned layers that a plurality of layers is arranged so that they can adjoin. The correction layers can be partially formed on the surfaces of the two buildup layers 6, 7 over the wiring pattern areas in the two buildup layers. The correction layers can be formed on both surfaces of the two buildup layers 6, 7.

The correction layers can be formed by multiple layers. For example, one layer for correcting warpage due to the temperature variation and the other layer for the warpage due to the chemical shrinkage. The properties of the correction layers can be anisotropic. The warpage occurs due to the asymmetric properties of the organic substrate with respect to the core layer 5. The asymmetric properties are caused by the anisotropic properties of the buildup layers 6, 7 in the wiring area. Therefore if the correction layers which counter the anisotropy in the buildup layers 6, 7 in the wiring area are used, the warpage can be reduced. One way of creating the anisotropy in the correction layers is formation of oval via, or uses materials with anisotropic materials properties.

Figure 3:
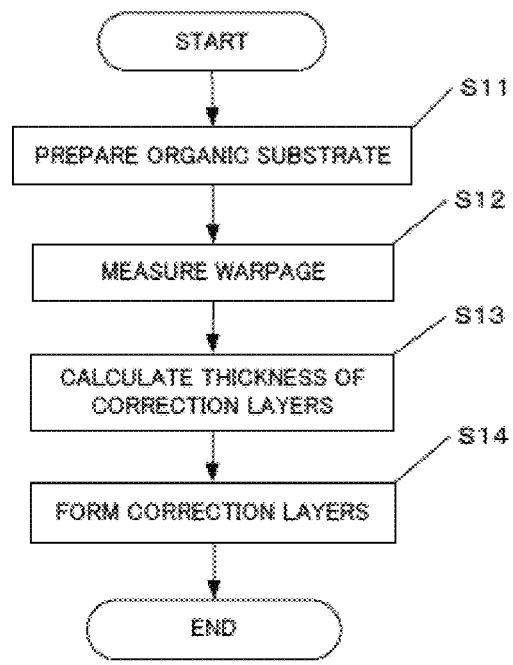
FIG. 3 is a chart showing a flow of a method of one embodiment of the present invention.

The correction layer has a thickness which has been calculated using properties of constituent materials including the coefficient of thermal expansion (CTE) and the Young's modulus of the core layer 5, and CTEs and the Young's modulus of the first and the second buildup layers 6,7 for reducing warpage of the organic substrate 1. Specifically, the thickness of the correction layer can be determined by using empirical equations or the set of theoretical equations as described later. Concerning the material characteristics of the correction layer, if the organic substrate 1 is warped towards the front side (upside), the correction layer on the surface of the buildup layer 7 includes materials with a high CTEs value and the correction layer on the surface of the buildup layer 6 includes materials with low CTE materials. On the other hand, if the organic substrate 1 is warped towards the back side (downside), the correction layer on the surface of the buildup layer 6 includes materials with a high CTEs value and the correction layer on the surface of the buildup layer 7 includes materials with low CTE materials FIG. 3 is a chart showing a flow of a method of one embodiment of the present invention. In step S11, an organic substrate is prepared first. The example of the organic substrate is as having been explained above with reference to FIG. 1. In step S12, the warpage of the organic substrate is measured. The measurement is performed by measuring the surface shape of the organic substrate's diagonal, for example. In step S13, the thickness of the correction layer is calculated by using empirical equations or the set of theoretical equations.

Figure 4:
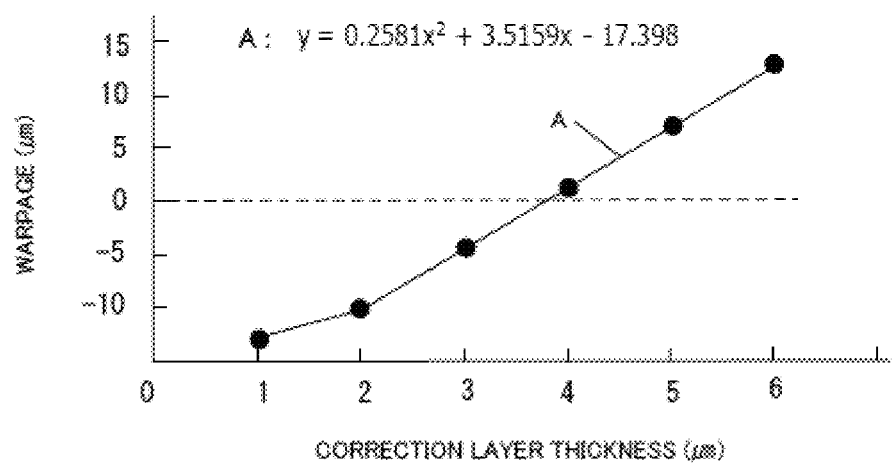
FIG. 4 is a graph showing the relationship between the correction layer thickness and the warpage of the organic substrate of one embodiment of the present invention.

FIG. 4 is a graph showing the relationship between the correction layer thickness and the warpage of the organic substrate of one embodiment of the present invention. The curve A (the empirical equation y) shown in FIG. 4 has been obtained as an experimental result as follows. The correction layer is applied on the substrate to be corrected. The warpage of the substrate is measured. The warpage values of the several thickness values are determined. The relationship between the correction layer thickness and the warpage of the substrate is determined from the experimental curve. The thickness of the correction layer is calculated by using empirical equation y in FIG. 4.

Figure 5:
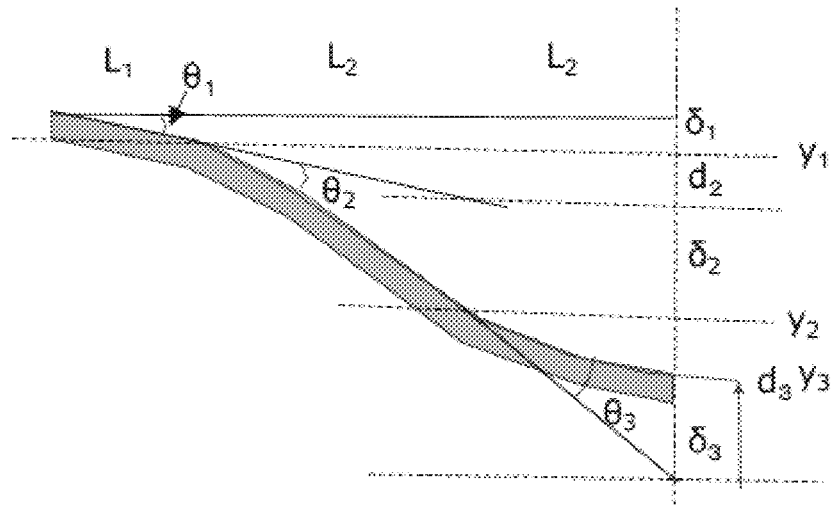
FIG. 5 is a diagram for explaining the calculation method of the thickness of the correction layer of one embodiment of the present invention.

The thickness of the correction layer is calculated by using the set of theoretical equations as follows:
(a) The substrate warpage for obtaining the correction layer thickness is determined by first dividing the substrate in in-plane direction and calculating the warpage of each section using the equivalent properties of the divided section in each layer.
(b) Finite Element Method (FEM) can be used to calculate the warpage of each section of the layer, but the automation is difficult with FEM and the throughput will be low because of the calculation time.
(c) Automation can be done with the Beam Theory, but the accuracy will be low since it does not take account of the change in materials properties in in-plane direction.
(d) Therefore the correction layer thickness is determined by first obtaining the warpage of the each divided area by the Beam Theory using the values of thickness of each layer and equivalent properties of each layer determined from the copper loading ratio. The warpage is determined by equations shown in FIG. 5 which takes into the account of the change in materials properties in in-plane direction.

Figure 6:
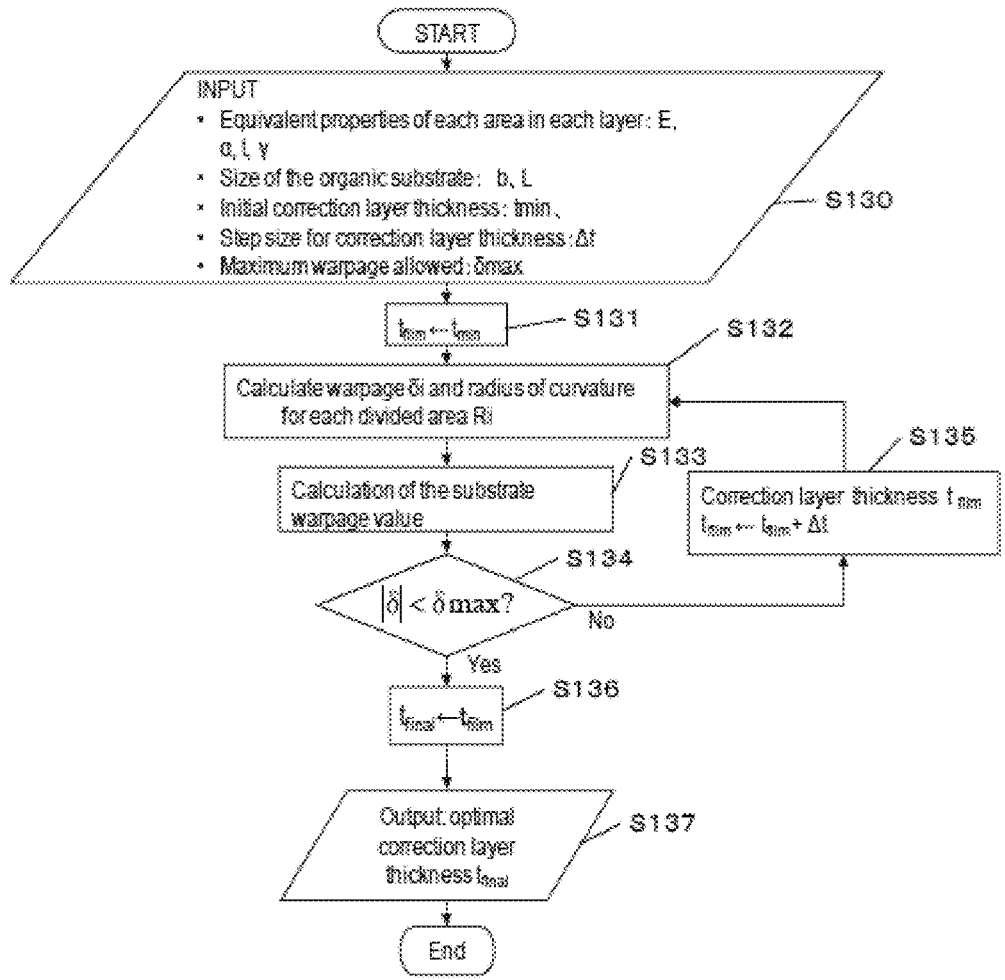
FIG. 6 is a chart showing a flow of calculation of the thickness of the correction layer of one embodiment of the present invention.

FIG. 6 is a chart showing a flow of calculation of the thickness of the correction layer of one embodiment of the present invention. The flow of FIG. 6 is performed by a controller (computer) described later referring FIG. 8. The execution of the flow is performed using the predetermined software. The software which has program instructions can be embodied in a computer program product including a computer readable storage medium. The program instructions can be executed by a controller (computer) after the program instructions have been read out from the computer readable storage medium.

In step S130 of FIG. 6, following values for each divided section in each substrate layer are inputted (set):
E: Equivalent Young's modulus
$\alpha$: Equivalent coefficient of thermal expansion
$\gamma$: coefficient of chemical shrinkage
t: substrate layer thickness
b, L: size of the organic substrate $t_{min}$: initial correction layer thickness
Δt: step size for correction layer thickness
δmax: maximum warpage allowed In step S131, $t_{min}$ is set to $t_{film}$. In step S132, Warpage δi and Radius of curvature for each divided area Ri are calculated, for example using equations shown in FIG. 5. In step S133, the value of the substrate warpage is calculated using empirical equation γ in FIG. 4 or theoretical equations shown in FIG. 5. In step S134, it is judged whether the absolute value of sigma is smaller than sigma max. If the judgment result is No, in step S135, the correlation layer thickness $t_{film}$ is set to $t_{film}$+Δt and go back to step S132. If the judgment result is Yes of step S134, in step S136, the correlation layer thickness $t_{film}$ is set to $t_{final}$. In next step S137, the thickness $t_{final}$ is outputted (obtained) as an optimal correction layer thickness.

Referring FIG. 3, in step S14, at least one correction layer having the thickness obtained by step S13 is formed on at least one part of surfaces of the buildup layers 6, 7 of FIG. 1. The example of the layout, construction, materials properties, etc. of the correction layers is as having been explained above with reference to FIG. 2. The correction layers including patterned layers can be formed by a jet dispenser or a 3D printer, for example.

Figure 7:
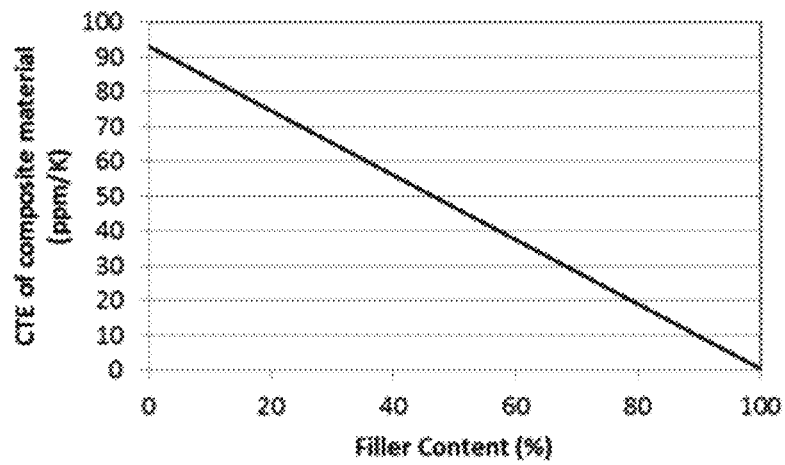
FIG. 7 is an example of the relationship between the CTE of the composite material and the filler content.

The materials for correction layers can be composites of matrix resin and filler. The matrix resin for the composites can be acrylic resin such as polymethyl methacrylate (PMMA), epoxy resin, polyimide resin, polytetrafluoroethylene (PTFE), for example. The CTE of the composite can be controlled by mixing fillers into the resin matrix. The examples of fillers are $SiO_2$, $Al_2O_3$, $CaCO_3$, AlN, BN and BeO. FIG. 7 shows an example of the relationship between the CTE of the composite material and the filler content when the matrix resin is epoxy resin (93 ppm/K) and silicon dioxide filler (0.5 ppm/K).

Figure 8:
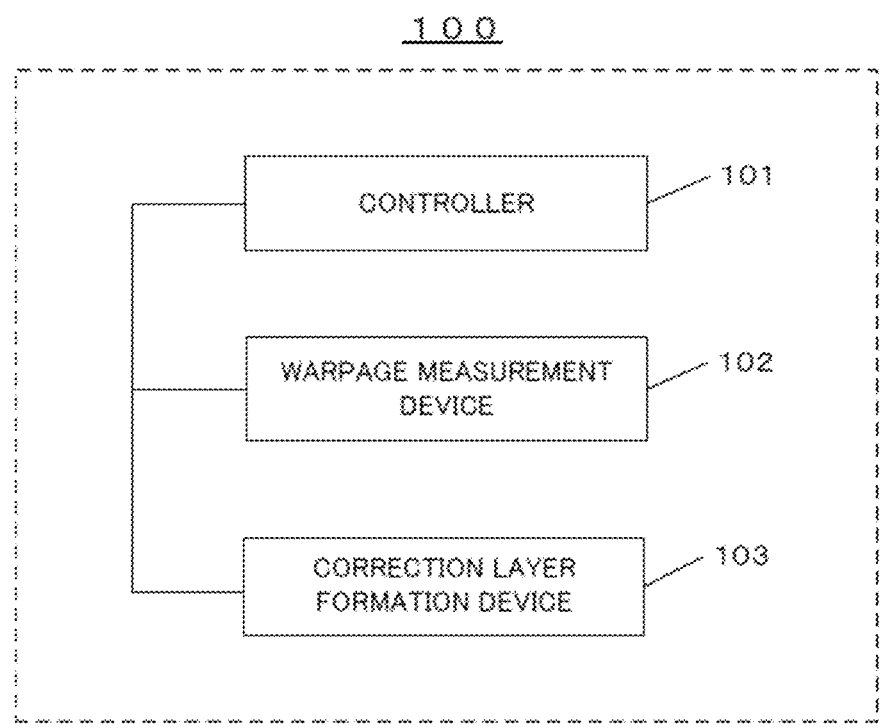
FIG. 8 is a diagram showing a configuration example of system for correcting warpage of an organic substrate of one embodiment of the present invention.

FIG. 8 is a diagram showing a configuration example of system for correcting warpage of an organic substrate of one embodiment of the present invention. The system 100 includes a controller 101, a warpage measurement device 102 and a correction layer formation device 103. The controller 101 can include a computer. The controller 101 obtains warpage value of the organic substrate from the warpage measurement device 102 and calculates the thickness of the correction layer using the flow of calculation of the thickness shown in FIG. 6. The controller 101 provides the calculated thickness of the correction layer to the correction layer formation device 103. The warpage measurement device 102 can include a surface profile measurement tool/device for example such as Talysurf. The surface profile measurement tool/device can measure the surface shape of the organic substrate's diagonal. The correction layer formation device 103 forms the correction layer having thickness provided by the controller 101. The correction layer formation device 103 can include a jet dispenser or a 3D printer, for example.

EXAMPLE 1

The organic substrate's warpage values are simulated by finite element analysis. The correction layer is formed on the front side, in the wiring area between the chip and the lid. The simulation shows that the absolute value of warpage becomes the smallest when the thickness of the correction layer is 24 μm. Therefore we confirmed that the warpage can be minimized by formation of partial correction layer.

EXAMPLE 2

The organic substrate's warpage values are simulated by finite element analysis. The correction layer is in the wiring area between the chip and the lid on the front side, and the same area in the back side. The simulation shows that the absolute value of warpage becomes the smallest when the thickness of the correction layers is 20 μm. Therefore we confirmed that the warpage can be minimized by formation of partial correction layers on the both sides of the substrate.

The embodiment of the present invention has been described with reference to the accompanying drawings. However, the present invention is not limited to the embodiment. The present invention can be carried out in forms to which various improvements, corrections, and modifications are added based on the knowledge of those skilled in the art without departing from the purpose of the present invention.

What is claimed is:

1. An organic substrate comprising:
   a core layer including organic materials;
   a first buildup layer on a top surface of the core layer;
   a second buildup layer on a bottom surface of the core layer; and
   at least one correction layer formed on at least one part of surfaces of the first buildup layer and the second buildup layer,
   wherein a correction layer of the at least one correction layer has a thickness which has been calculated using properties of constituent materials including the coefficient of thermal expansion (CTE) and the Young's modulus of the core layer, and CTEs and the Young's modulus of the first and the second buildup layers for reducing warpage of the organic substrate, and wherein materials for the correction layer are composites of matrix resin and filler.

2. The organic substrate according to claim 1,
   wherein the correction layer on the surface of the second buildup layer includes first materials of the materials with a high CTEs value and the correction layer on the surface of the first buildup layer includes second materials of the materials with low CTE materials, if the organic substrate being warped towards the front side,
   wherein the correction layer on the surface of the first buildup layer includes first materials of the materials with a high CTEs value and the correction layer on the surface of the second buildup layer includes second materials of the materials with low CTE materials, if the organic substrate being warped towards the back side.

3. The organic substrate according to claim 1,
   wherein the correction layer is formed on at least one part of surfaces of the first buildup layer and the second buildup layer, so that a chip area, a under fill area and a lid area in the surface of the first buildup layer or a ball grid arrays (BGA) pads area in the surface of the second buildup layer being avoided.

4. The organic substrate according to claim 1,
   wherein a plurality of patterned correction layers of the at least one correction layer is formed on at least one part of surfaces of the first buildup layer and the second buildup layer.

5. The organic substrate according to claim 1,
   wherein the correction layer is partially formed on the surfaces of the first buildup layer and the second buildup layer over the wiring pattern areas in the two layers.

6. The organic substrate according to claim 1,
   wherein the matrix resin is an acrylic resin.

7. The organic substrate according to claim 1,
   wherein a plurality of patterned correction layers of the at least one correction layer is formed by a jet dispenser.

8. The organic substrate according to claim 1, wherein a plurality of patterned correction layers of the at least one correction layer is formed by a three-dimensional (3D printer).

* * * * *